United States Patent
Dusija et al.

(10) Patent No.: US 9,218,886 B2
(45) Date of Patent: *Dec. 22, 2015

(54) STRING DEPENDENT PARAMETER SETUP

(71) Applicant: SanDisk Technologies Inc., Plano, TX (US)

(72) Inventors: Gautam A. Dusija, Milpitas, CA (US); Yingda Dong, San Jose, CA (US); Chris Avila, Saratoga, CA (US); Deepak Raghu, Milpitas, CA (US); Pao-Ling Koh, Fremont, CA (US)

(73) Assignee: SanDisk Technologies, Inc., Plano, TX (US)

( * ) Notice: Subject to any disclaimer, the term of this patent is extended or adjusted under 35 U.S.C. 154(b) by 65 days.

This patent is subject to a terminal disclaimer.

(21) Appl. No.: 14/101,992

(22) Filed: Dec. 10, 2013

(65) Prior Publication Data

US 2015/0162088 A1 Jun. 11, 2015

(51) Int. Cl.
| | |
|---|---|
| *G11C 11/34* | (2006.01) |
| *G11C 16/10* | (2006.01) |
| *G06F 12/02* | (2006.01) |
| *G06F 11/10* | (2006.01) |
| *G11C 16/04* | (2006.01) |

(52) U.S. Cl.
CPC .......... *G11C 16/107* (2013.01); *G06F 11/1068* (2013.01); *G06F 12/0246* (2013.01); *G11C 16/0408* (2013.01); *G11C 16/0466* (2013.01); *G06F 2212/7207* (2013.01); *G06F 2212/7211* (2013.01)

(58) Field of Classification Search
CPC ................... G06F 11/1068; G06F 2212/7211; G06F 17/5068; G06F 2212/1016; G06F 3/0649; G06F 3/0679; G06F 3/0688
USPC ............. 365/185.13, 185.03, 185.05, 185.06, 365/185.11, 185.17, 185.18, 185.19, 185.23
See application file for complete search history.

(56) References Cited

U.S. PATENT DOCUMENTS

| | | | |
|---|---|---|---|
| 5,070,032 | A | 12/1991 | Yuan et al. |
| 5,095,344 | A | 3/1992 | Harari |
| 5,313,421 | A | 5/1994 | Guterman et al. |
| 5,315,541 | A | 5/1994 | Harari et al. |
| 5,343,063 | A | 8/1994 | Yuan et al. |
| 5,570,032 | A | 10/1996 | Atkins et al. |
| 5,595,924 | A | 1/1997 | Yuan et al. |
| 5,661,053 | A | 8/1997 | Yuan |
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |

(Continued)

OTHER PUBLICATIONS

Fukuzumi et al., "Optimal Integration and Characteristics of Vertical Array Devices for Ultra-High Density, Bit-Cost Scalable Flash Memory," Electron Devices Meeting, 2007, IEDM 2007, IEEE International, pp. 449-452.

(Continued)

*Primary Examiner* — Fernando Hidalgo
(74) *Attorney, Agent, or Firm* — Davis Wright Tremaine LLP

(57) ABSTRACT

In a three-dimensional NAND memory in which a block contains multiple separately-selectable sets of strings connected to the same set of bit lines, sets of strings are zoned, and different operating parameters applied to different zones. Operating parameters for a zone are obtained from characterizing a reference set of strings in the zone.

20 Claims, 13 Drawing Sheets

(56) References Cited

U.S. PATENT DOCUMENTS

| | | | |
|---|---|---|---|
| 6,222,762 | B1 | 4/2001 | Guterman et al. |
| 7,646,636 | B2 | 1/2010 | Kim |
| 7,817,473 | B2 | 10/2010 | Lee et al. |
| 7,872,929 | B2 | 1/2011 | Dell et al. |
| 7,960,778 | B2 | 6/2011 | Lee |
| 8,089,811 | B2 | 1/2012 | Kang et al. |
| 8,169,827 | B2 | 5/2012 | Guzzi et al. |
| 8,291,295 | B2 | 10/2012 | Harari et al. |
| 8,472,257 | B2 | 6/2013 | Dong et al. |
| 2011/0060862 | A1 | 3/2011 | Warren |
| 2012/0008399 | A1* | 1/2012 | Hoei et al. ............... 365/185.17 |
| 2012/0220088 | A1 | 8/2012 | Alsmeier |
| 2012/0275233 | A1* | 11/2012 | Sarin et al. ............... 365/185.19 |
| 2013/0007353 | A1* | 1/2013 | Shim et al. .................... 711/103 |
| 2013/0094290 | A1* | 4/2013 | Sridharan et al. ........ 365/185.03 |
| 2013/0107628 | A1 | 5/2013 | Dong et al. |
| 2014/0063902 | A1* | 3/2014 | Sunkavalli et al. ........... 365/148 |

OTHER PUBLICATIONS

Jung et al., "Three Dimensionally Stacked NAND Flash Memory Technology Using Stacking Single Crystal Si Layers on ILD and TANOS Structure for Beyond 30 nm Mode," Electron Devices Meeting, 2006, 4 pages.

Office Action for U.S. Appl. No. 14/289,243 mailed Aug. 28, 2014, 20 pages.

Notice of Allowance and Fees due for U.S. Appl. No. 14/289,243 mailed Dec. 24, 2014, 8 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

U.S. Appl. No. 13/791,200, filed Mar. 8, 2013, 37 pages.

U.S. Appl. No. 14/064,823, filed Oct. 28, 2013, 48 pages.

* cited by examiner

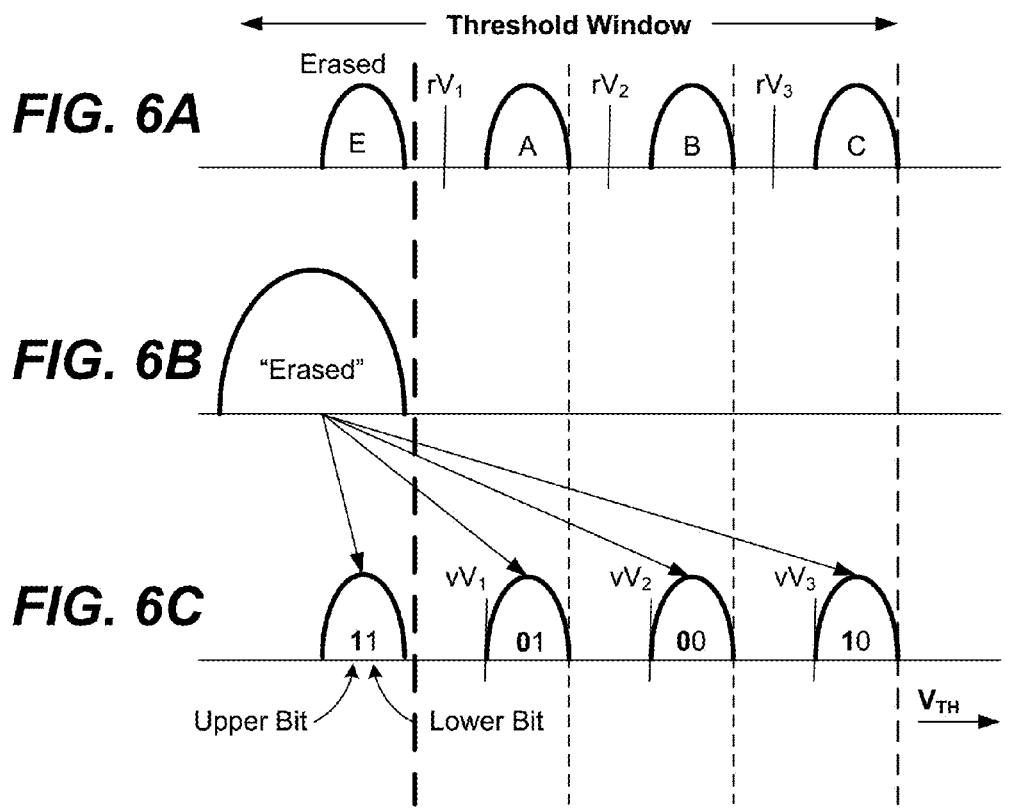
Programming into four states represented by a 2-bit code

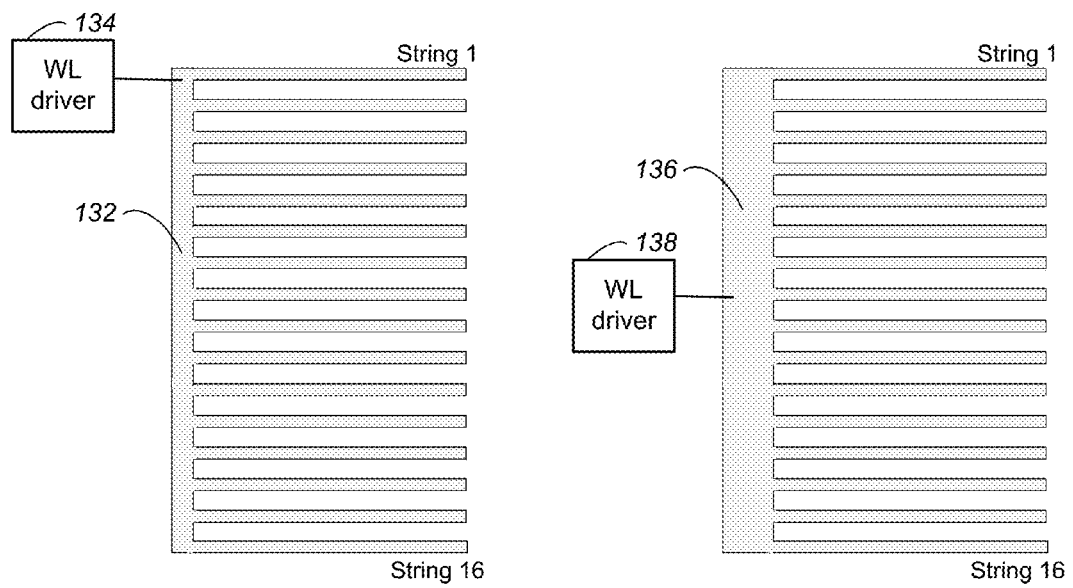
FIG. 10A
FIG. 10C
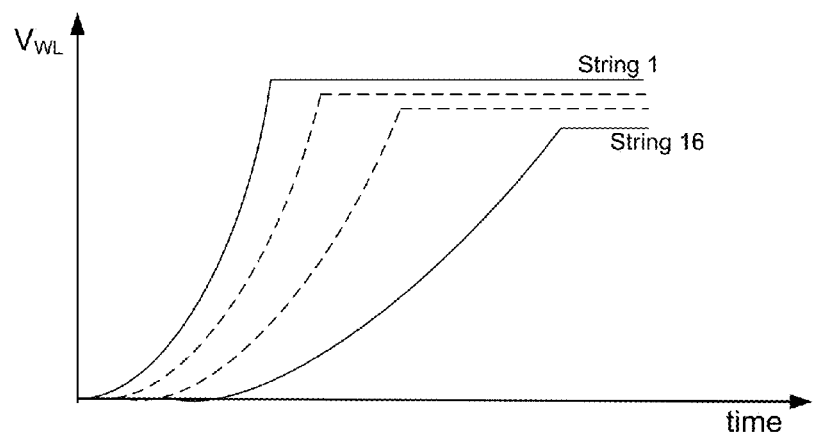
FIG. 10B

STRING DEPENDENT PARAMETER SETUP

BACKGROUND

This application relates to the operation of re-programmable nonvolatile three dimensional memory systems such as semiconductor flash memory which record data using charge stored in charge storage elements of memory cells.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both generally utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

In certain 3-D NAND charge-storage memory arrays, an individual block contains multiple separately-selectable sets of NAND strings connected to the same set of bit lines. Memory cells of such sets of strings may have different properties according to location, with sets of strings at edges of a block (adjacent to neighboring blocks) having different characteristics to sets of strings located in the interior of the block. Sets of strings may be zoned accordingly, and operating parameters may be separately configured for each such zone. Operating parameters for a given zone may be obtained from a reference set of strings in the zone. A reference set of strings for programming may be the first programmed set of strings in a zone so that characterization data obtained during programming of the reference set of strings may be used to optimize operating parameters for subsequent sets of strings in the same zone when data is programmed.

An example of a method of operating a three-dimensional NAND memory array in which a conductive body forms a word line for each of a plurality of separately selectable sets of strings of a block includes: configuring at least one operating parameter for a first edge zone that includes one or more of the plurality of separately selectable sets of strings of the block according to characterization of a first reference set of strings that is in the first edge zone; configuring the at least one operating parameter for a second edge zone that includes one or more of the plurality of separately selectable sets of strings of the block according to characterization of a second reference set of strings that is in the second edge zone; and configuring the at least one operating parameter for a central zone that includes two or more of the plurality of separately selectable sets of strings of the block located between the first edge zone and the second edge zone, according to characterization of a third reference set of strings that is in the central zone.

The at least one operating parameter may be a programming voltage. The at least one operating parameter may be a read parameter. The first edge zone may consist of two sets of strings that are closest to a first edge of the block and the second edge zone consists of two sets of strings that are closest to a second edge of the block. Characterization of the first reference set of strings may include counting a number of programming pulses needed to program a word line of the first reference set of strings. Configuring at least one operating parameter for the first edge zone may include: using characterization information from programming a word line of the first reference set of strings with default parameters to determine a set of modified operating parameters and storing the set of modified operating parameters for subsequent programming of connected word lines of other strings of the first edge zone. The set of modified operating parameters may include modified programming parameters. The set of modified operating parameters may include modified reading parameters. The set of modified operating parameters may include modified erase parameters. The characterization of the first reference set of strings may include characterizing each word line of the reference set of strings.

An example of a method of operating a three-dimensional NAND memory array in which a conductive body forms a word line for each of a plurality of separately selectable sets of strings of a block may include: modifying programming parameters for a first zone of a block according to first programming test data obtained by programming a first reference set of strings in the first zone using default programming parameters, the first zone comprising a plurality of sets of strings; and modifying programming parameters for a second zone of the block according to second programming test data obtained by programming a second reference set of strings in the second zone using default programming parameters, the second zone comprising a plurality of sets of strings.

The first zone may include a plurality of sets of strings centrally located in the block. The second zone may include a plurality of sets of strings located at a periphery of the block. The first programming test data may include loop count data for individual word lines of the first reference set of strings. The first programming test data may include maximum programming voltage data for individual word lines of the first reference set of strings. Modifying the programming parameters for the first zone and the second zone may be performed during an initialization routine. Modifying the programming parameters for the first zone and the second zone may be performed subsequent to significant memory usage.

An example of a three dimensional nonvolatile memory array includes: a block that comprises a plurality of zones, each zone containing at least one separately selectable set of strings, corresponding word lines of all sets of strings in the block formed from a continuous conductive body; a first reference set of strings in a first zone, the first reference set of strings providing characterization data to configure operating parameters for the first zone; and a second reference set of strings in a second zone, the second reference set of strings providing characterization data to configure operating parameters for the second zone.

A programming circuit may be configured to apply a first set of programming conditions when programming word lines in the first zone and configured to apply a second set of programming conditions when programming word lines in the second zone. A reading circuit may be configured to apply a first set of reading conditions when reading word lines in the first zone and configured to apply a second set of reading conditions when reading word lines in the second zone. The first zone may consist of sets of strings that do not lie along edges of the block and the second zone may include a set of strings that lies along an edge of the block.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of memory cells.

FIGS. 10A-10C illustrate different characteristics of different sets of strings.

DETAILED DESCRIPTION

Memory System

Figure 1:
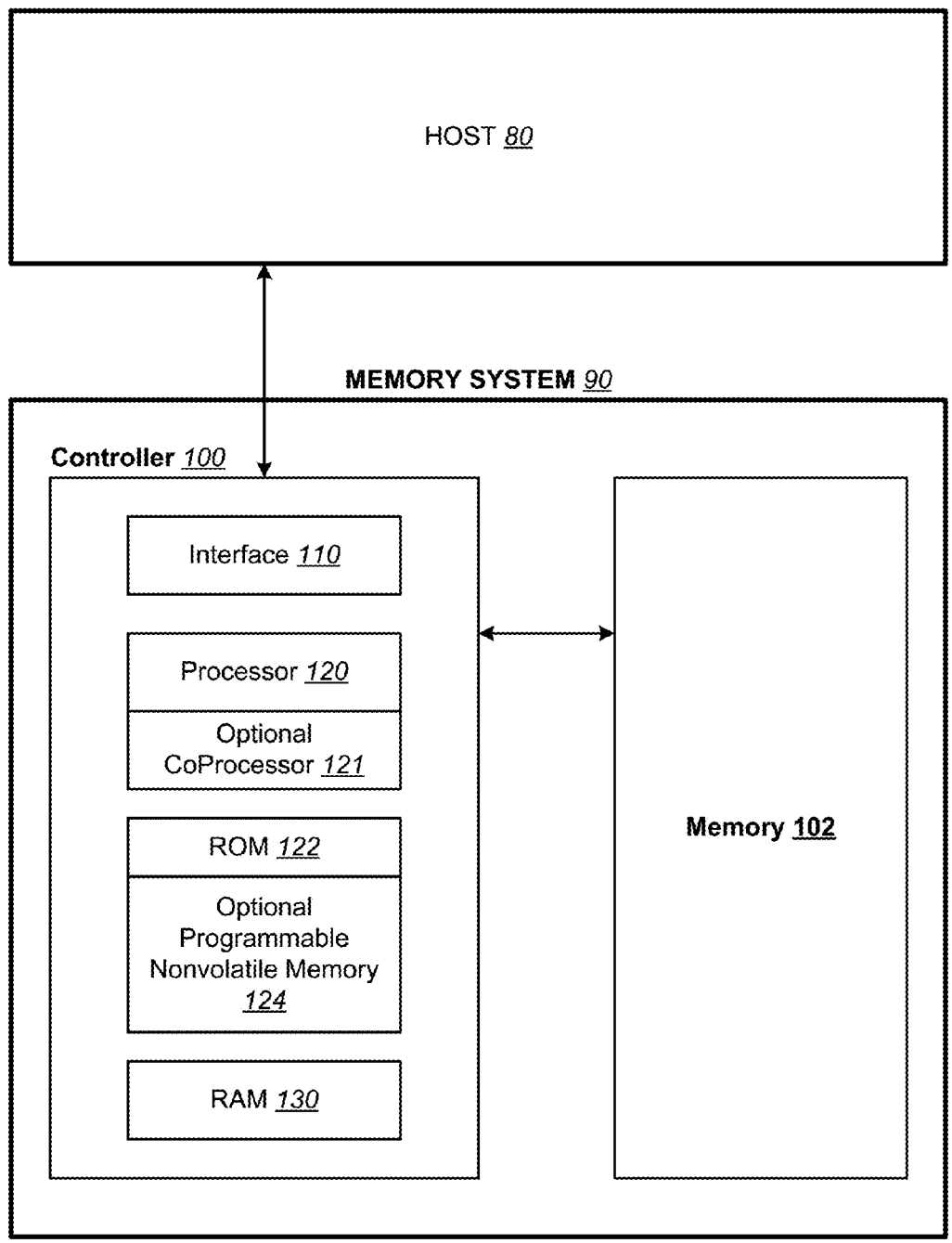
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
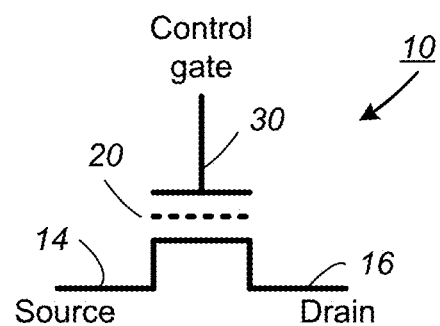
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
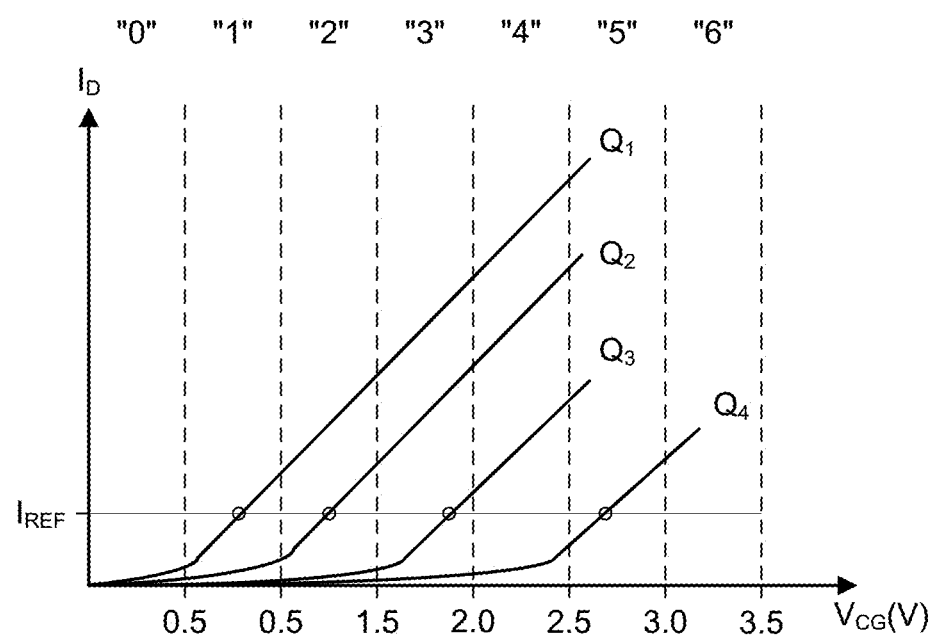
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
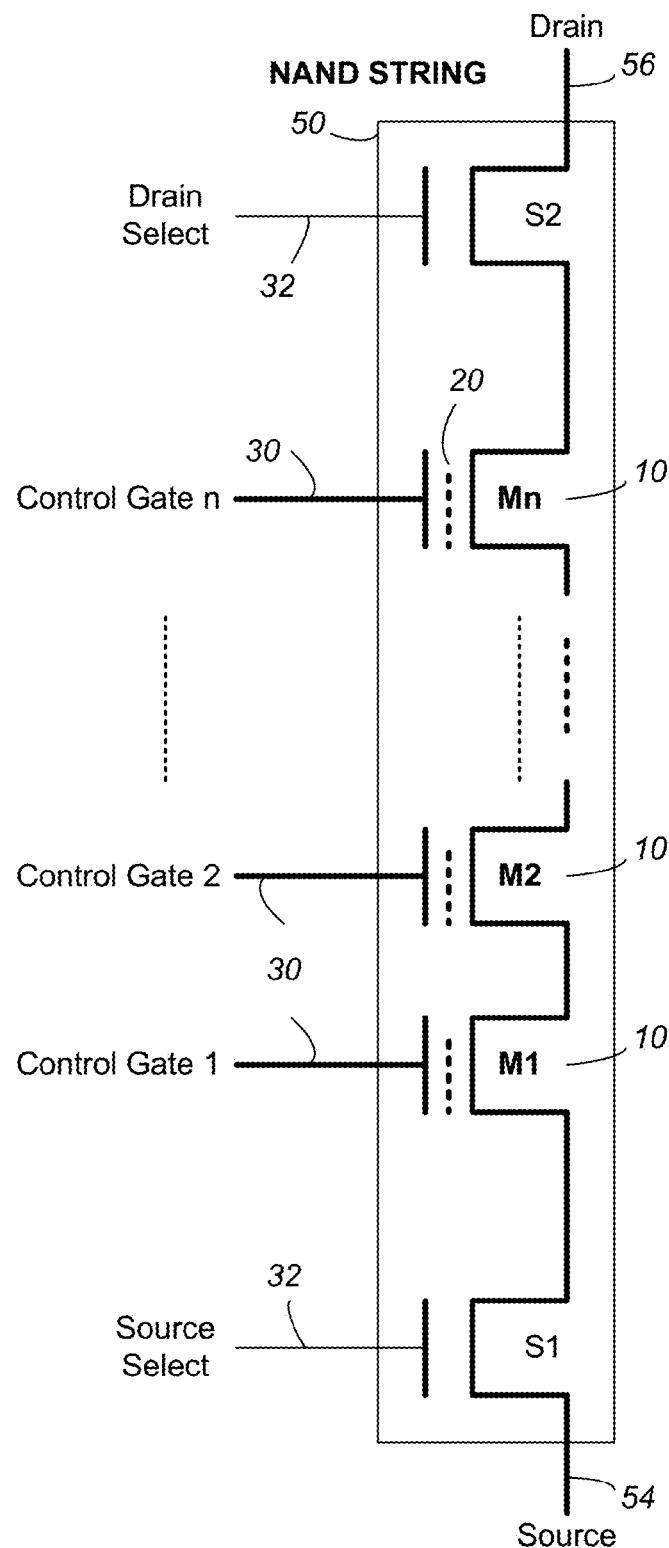
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n×4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
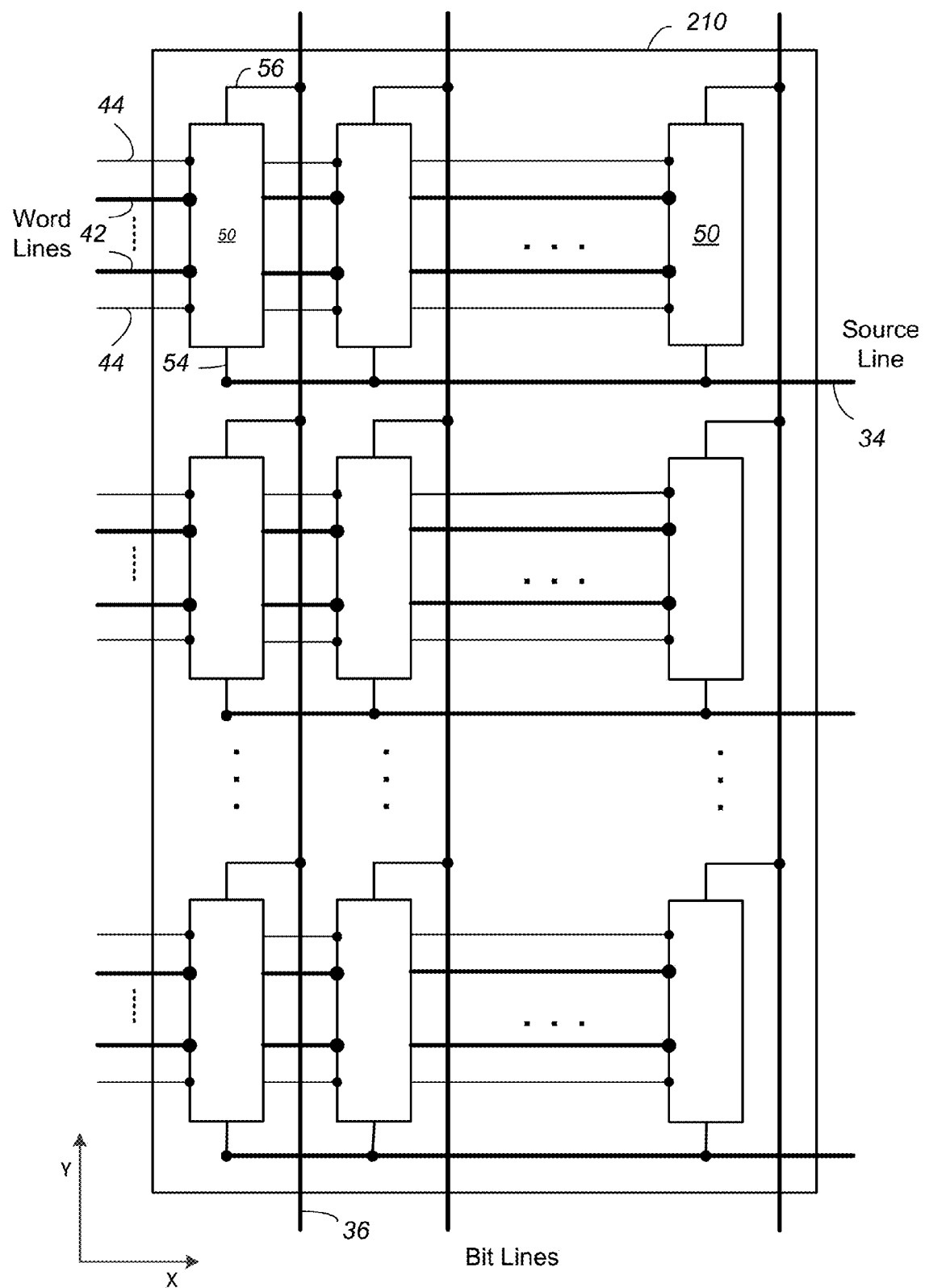
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
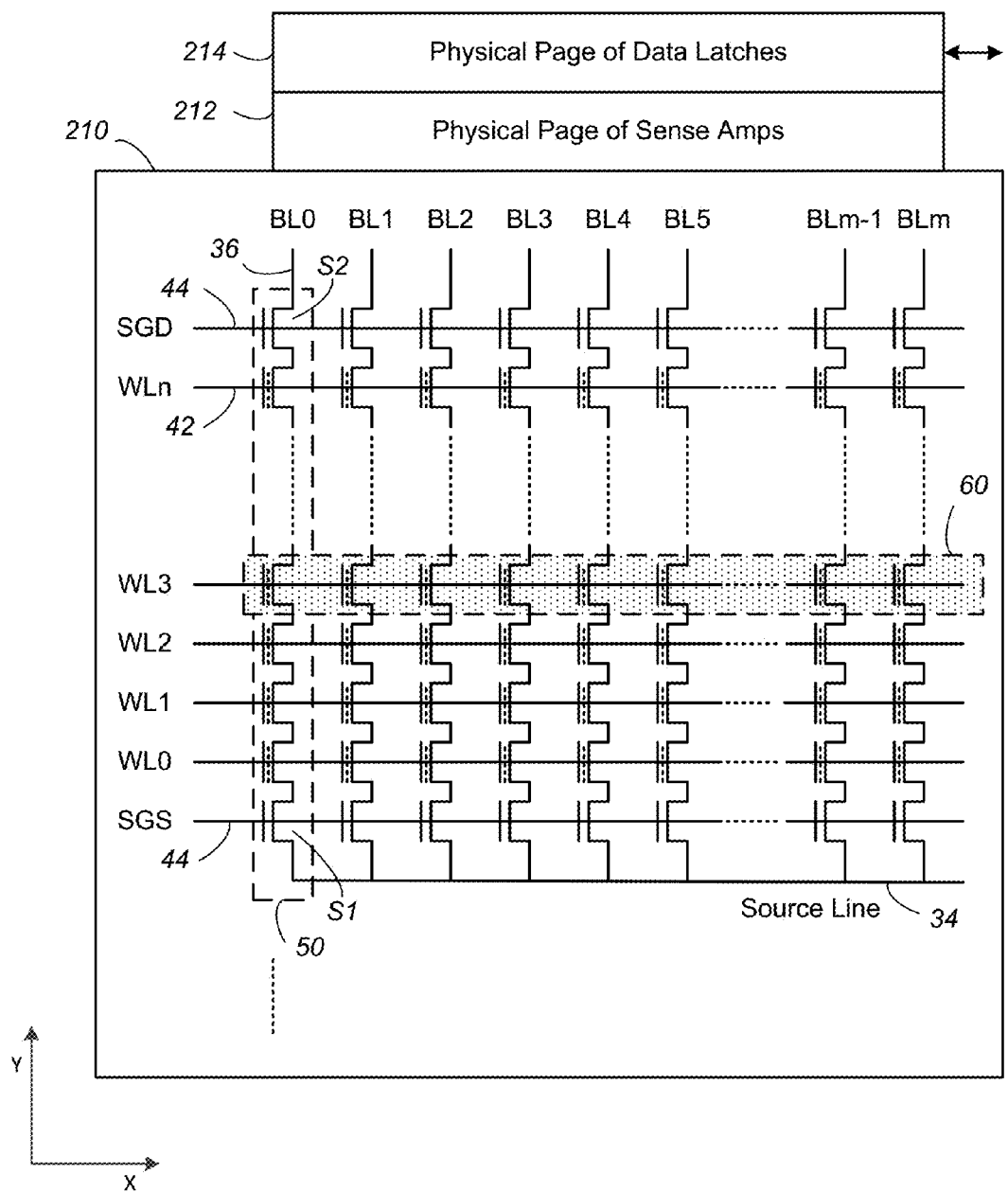
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "E" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 7:
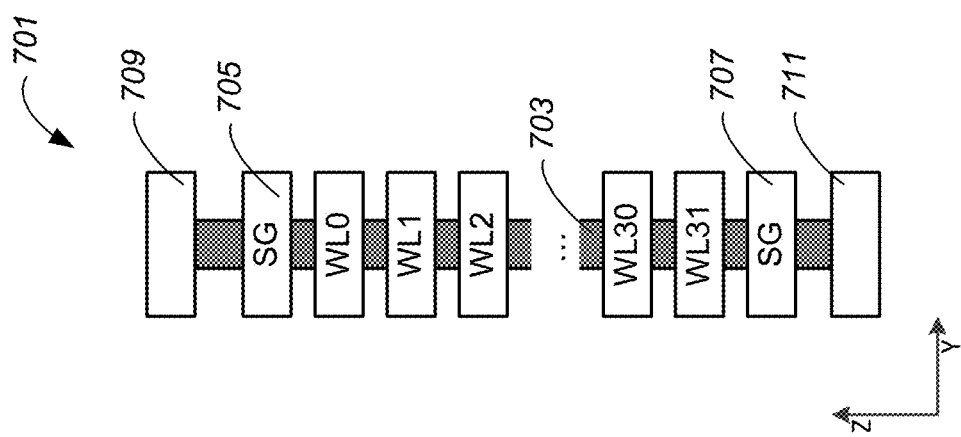
FIG. 7 shows an example of a physical structure of a 3-D NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
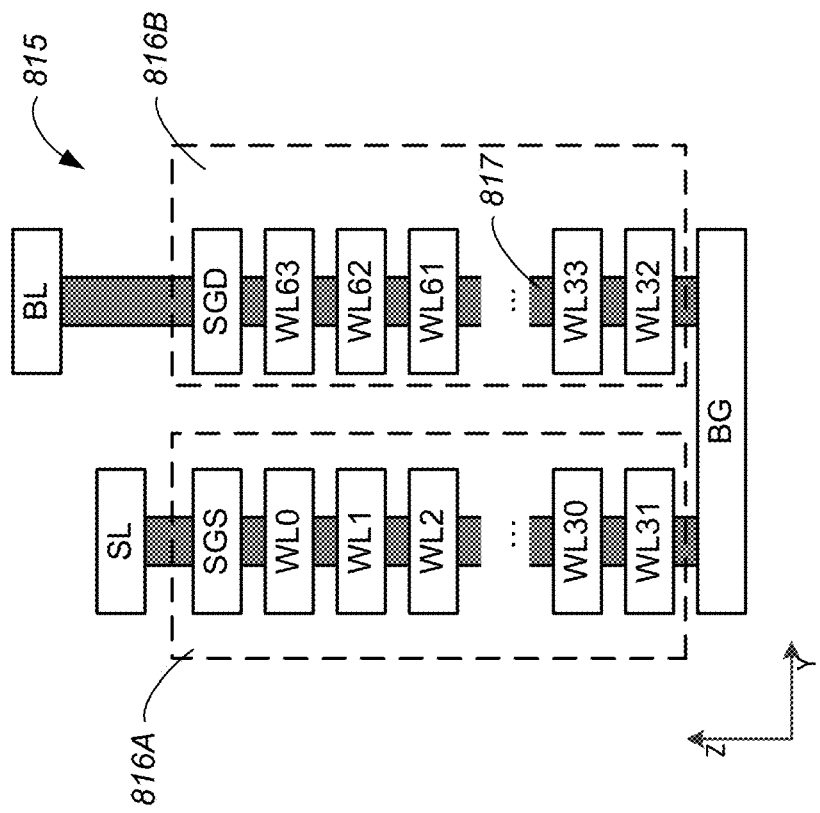
FIG. 8 shows an example of a physical structure of a U-shaped 3-D NAND string.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
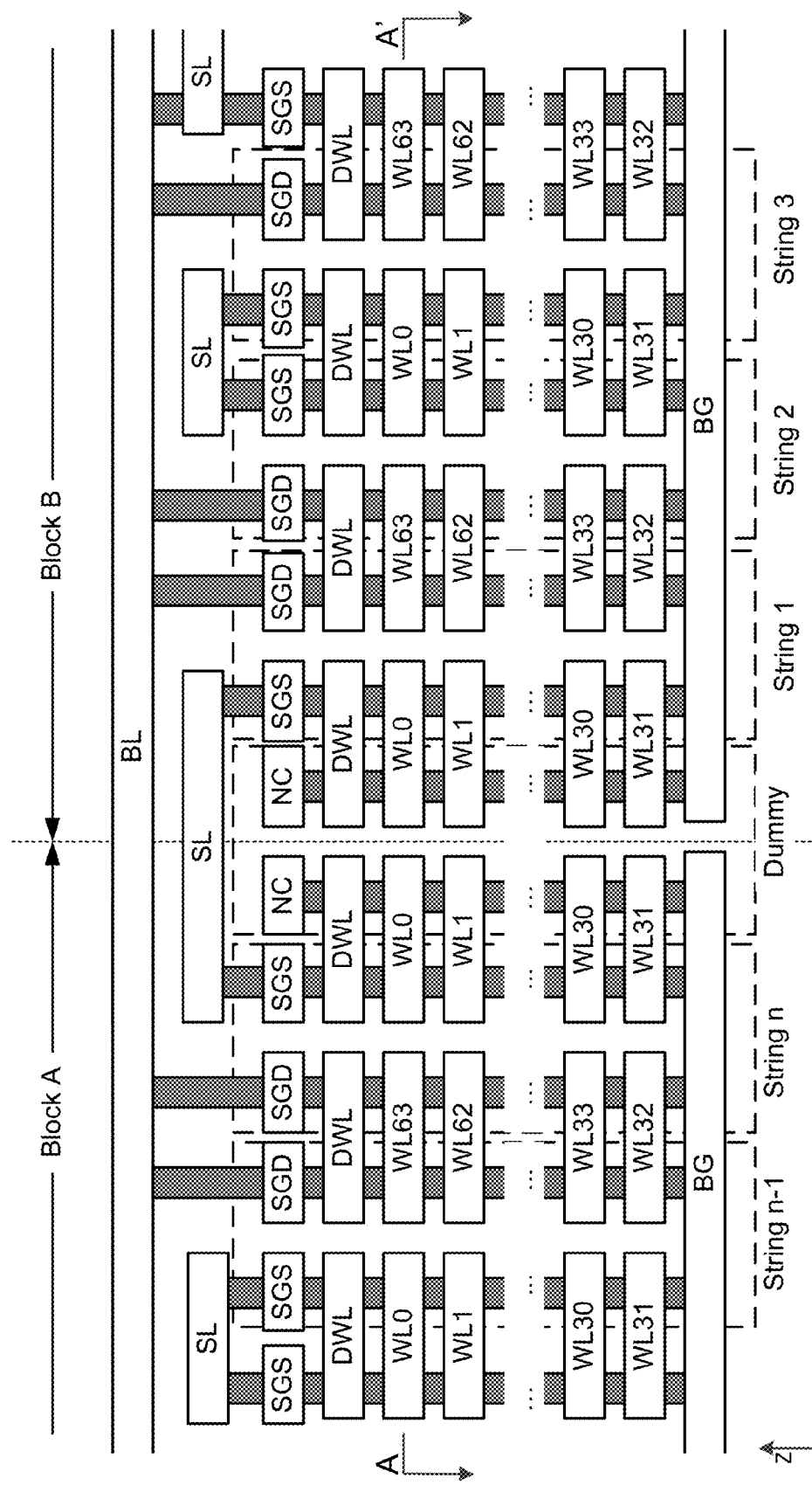
FIG. 9A shows a cross section of a 3-D NAND memory array in the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9A shows where two blocks meet. Block A contains n strings connected to the bit line BL. While only strings n, and n−1 of Block A are shown, it will be understood that the repetitive structure continues to the left where strings 1 to n−2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines extending along the y-direction, separated from each other in the x-direction (e.g. behind the plane of the cross section shown). Word lines extend in the x-direction, perpendicular to the plane of FIG. 9A, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32 WL63 that are formed by common conductive strips. In contrast, select lines are not shared between neighboring strings. This allows separate selection of an individual set of strings within a block, even though the selected set of strings may include word lines that are not separately controllable from word lines of unselected strings.

FIG. 9A shows dummy word lines "DWL" separating select lines SGD, SGS, from host data word lines WL0-WL63. While host data word lines are used to store host data (i.e. data that may be sent to the memory from an external source with the expectation that the data will be returned in response to a read command), dummy word lines do not store host data. They may store nothing, or may store some dummy data that puts the dummy cells in a desirable condition (e.g. puts their threshold voltages at levels that make accessing other cells easier, or reduces risk of disturbance). The dummy word lines shown provide some protection for stored data.

Each block has a separate back gate, BG, so that back gate transistors of different blocks may be separately controlled. Back gates extend in the x-direction, perpendicular to the cross section of FIG. 9A, so that all back gate transistors of a block are controlled by a common back gate in this example. Control circuits are connected to the back gates of each block so that appropriate bias may be applied to back gates. In other examples, U-shaped NAND strings may have both wings permanently connected together so that no back gate is used.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 9B:
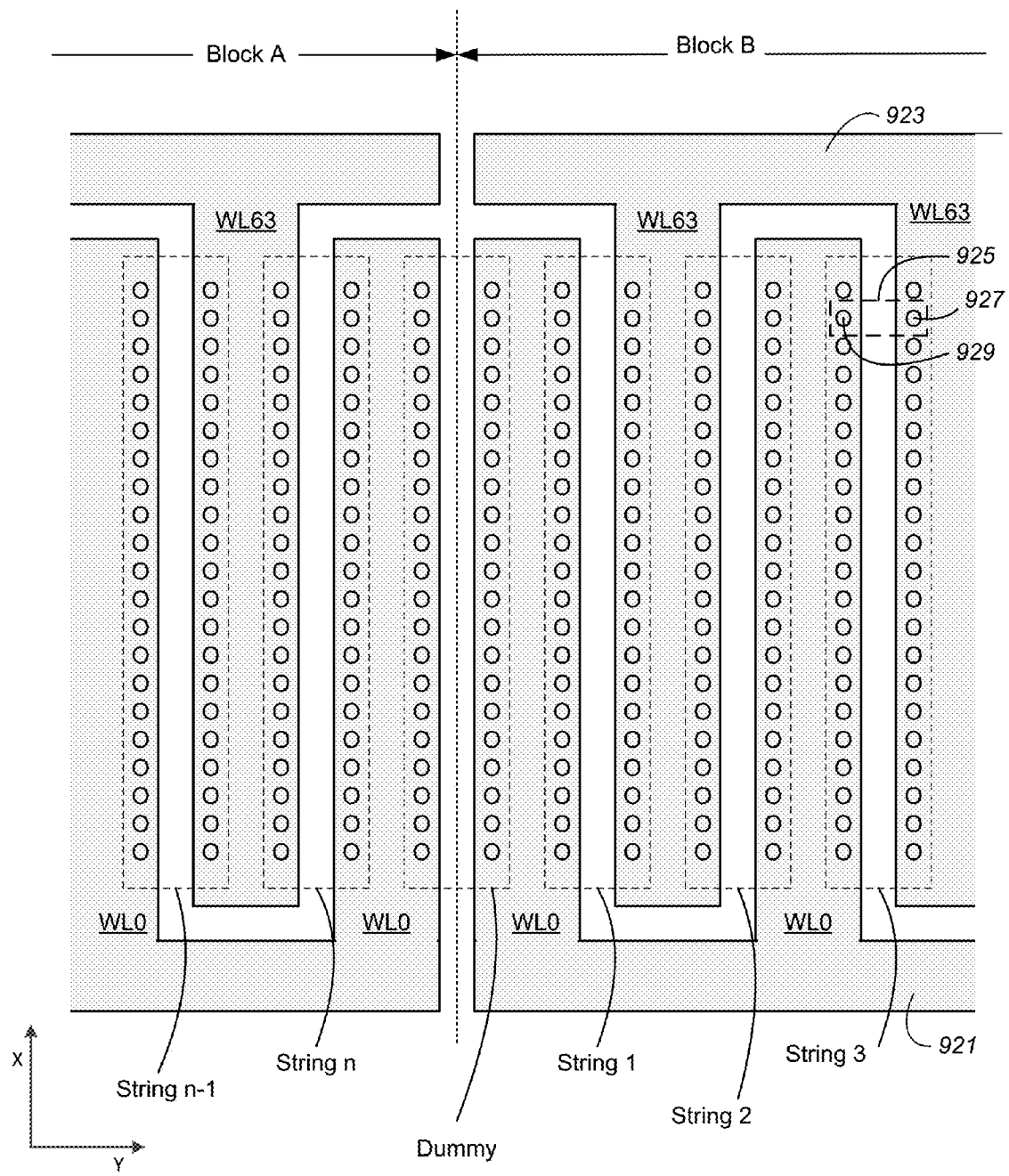
FIG. 9B shows a cross section of the memory array of FIG. 9A along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on). Word lines of different blocks are isolated from each other. Thus, WL0 of Block A is separate, and electrically isolated from WL0 of Block B. Similarly, WL63 of Block A is separate, and electrically isolated from WL0 of Block B.

FIG. 10A further illustrates an electrically conductive body 132 that extends to form word lines of 16 sets of strings numbered 1-16 (similar to FIG. 9B, but with separate word lines for each string—not shared between neighboring strings). A word line driver 134 is connected to the electrically conductive body 132 in order to control the voltage on word lines when accessing the block (e.g. during read, write, and erase operations). However, the pattern of word lines formed from the electrically conductive body tends to produce some differences from a word line of one string to a corresponding word line of another string. For example, the word line driver 134 attaches close to the word line of string 1, but much farther away from the corresponding word line of string 16, and strings 1 and 16 are at edges of the block, adjacent to neighboring blocks while other strings are in the middle of the block and are far away from neighboring blocks. Differences like this tend to produce different voltage profiles on connected word lines of different strings.

FIG. 10B illustrates how voltages on word lines that are connected together may differ from each other. In the example of FIG. 10B, the word line driver 134 is driving the electrically conductive body 132 to a predetermined voltage (e.g. programming voltage, read voltage, pass voltage, or erase voltage). It can be seen that the voltage on the word line of string 1 ramps up faster than the voltage on the word line of string 16. This may simply be due to RC delay because of the greater distance to the word line of string 16. Word lines of other strings of the block ramp up at intermediate rates between the rate of string 1 and the rate of string 16 (as shown by dashed lines). FIG. 10B also shows string 1 reaching a higher steady state voltage compared with string 16. There may be some voltage drop over the extended distance to the word line of string 16 so that for a given target voltage, the word line of string 16 remains at a lower voltage than the word line of string 1 when a steady state condition is reached. Word line-to-word line differences may be different at different levels of a three dimensional memory array. For example, FIG. 10C shows another set of connected word lines formed of an electrically conductive body 136. Electrically conductive body 136 may have a somewhat different geometry to electrically conductive body 132 in order to facilitate connection to corresponding word line driver 138. Furthermore, word line driver 138 connects with electrically conductive body 136 at a different location (near string 8). Other layers may have word lines formed of electrically conductive bodies with different geometries and differently located connections to corresponding drivers which tend to produce different characteristics.

In addition to differences caused by such differing voltage profiles, memory cells in sets of strings that are at the edge of a block may have different behavior to memory cells in the interior of a block. For example, memory cells of string 1 and string 16 are adjacent to memory cells of other blocks on one side and may be affected by the neighboring blocks and by any dummy cells and dielectric provided between blocks. Interior cells, for example cells of string 8, have cells of the same block on either side and may be unaffected by neighboring blocks and by any dummy cells or dielectrics between blocks.

According to an aspect of the present invention a block is divided into zones and each zone may use different operating parameters to accommodate different characteristics of memory cells in those zones. For example, sets of strings along an edge, or near an edge of a block, may form an edge zone while sets of strings located in the interior of a block may form an interior zone.

Figure 11:
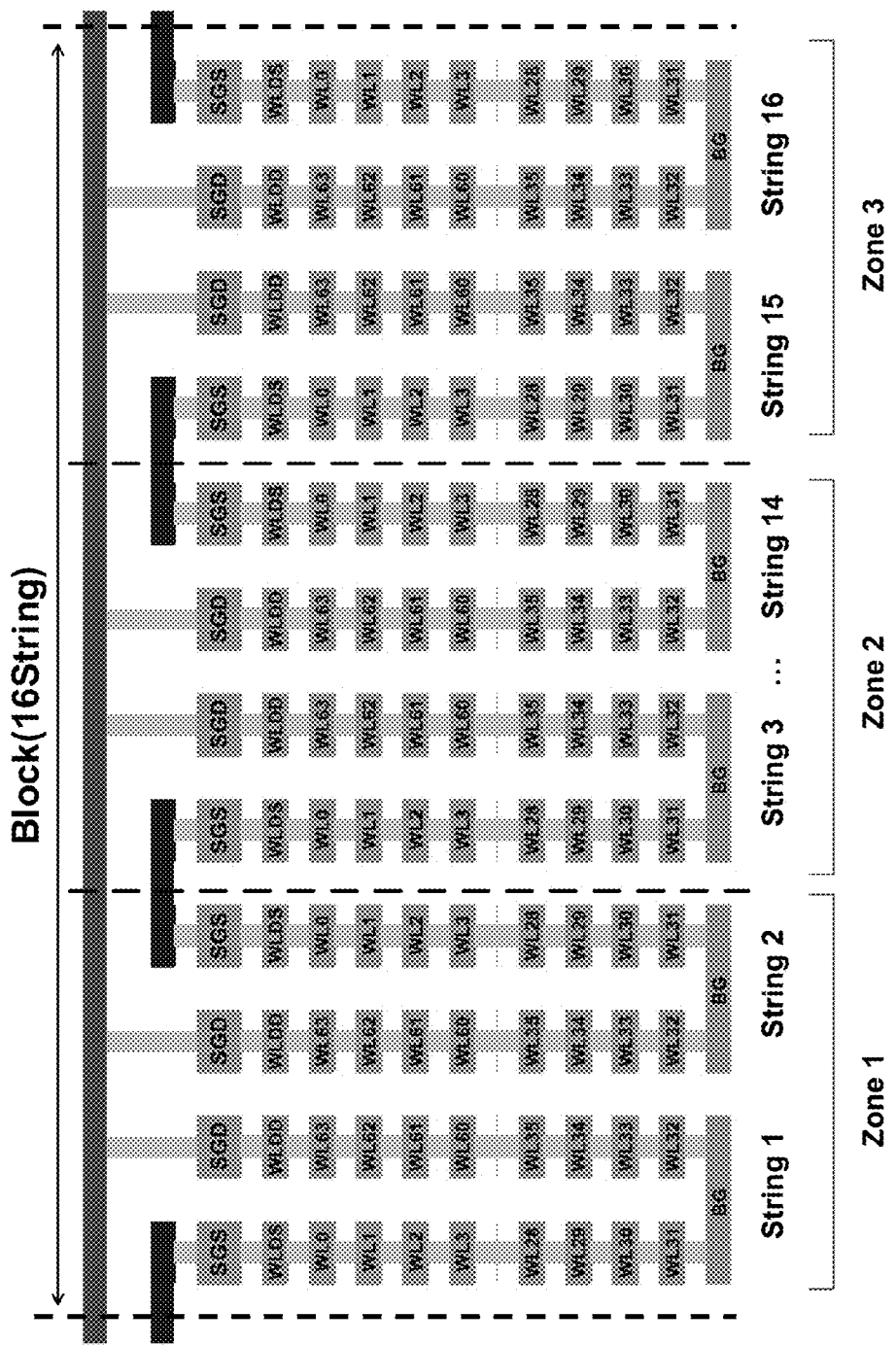
FIG. 11 shows zoning of sets of strings into three zones.

FIG. 11 shows a cross section of a block that includes 16 sets of strings that are formed with word lines that are electrically connected as previously described (word lines are shown as separate in this example, but may also be shared between neighboring strings). In this example, two sets of strings ("String 1" and "String 2") form a first zone ("Zone 1") which is located near the edge of the block and is therefore considered an edge zone. Interior sets of strings ("String 3" to "String 14") form a second zone ("Zone 2") which is considered an interior zone (strings 4-13 are omitted from FIG. 11). Two sets of strings ("String 15" and "String 16") form a third zone ("Zone 3") which is located near the edge of the block and is therefore considered an edge zone.

Each zone of FIG. 11 may use different operating parameters. For example, different programming voltages may be used in zone 1, zone 2, and zone 3. This may compensate for geometric effects, edge effects, or other effects. Operating parameters that are well adapted to their respective zones may be obtained by performing some characterization in each zone. For example, one set of strings in each zone may be considered a reference set of strings and may be used to obtain characterization information that is then used to configure operating parameters for the entire zone.

Various operating parameters may be modified from zone to zone. For example, different programming parameters may be used to perform programming operations in different zones. Programming voltage may be modified, and/or programming times may be modified, and/or number of programming pulses used, or other parameters may be modified from zone to zone based on results obtained from a sample set of strings in each zone. Read parameters may also be modified according to zone. Erase parameters may also be modified according to zone. While erase operations are generally performed on an entire block at a time so that all zones in a block would be similarly erased, erase verification may be performed on a sample word line. The erase verification parameters applied to such an operation may depend on the zone in which the sample word line is located and may be based on results obtained from a sample set of strings in that zone. Specific parameters that may be modified include erase voltage, and erase verify conditions.

Modifying operating parameters according to string based zones as described above may be combined with other modifications of operating parameters. For example, there may be variation in device characteristics from one die to another within a wafer, or from block to block within a die, or between word lines at different levels within a block, and some scheme may compensate for such variation by modifying certain operating parameters. For example, U.S. patent application Ser. No. 13/791,200, entitled, "Optimized Configurable NAND Parameters," filed on Mar. 8, 2013, which is hereby incorporated by reference in its entirety, describes modifying operating parameters according to level (i.e. vertical distance from substrate). Such level-based configuration may be combined with string-based configuration to provide operating parameters that are different from zone to zone in a given level and different from level to level within a given zone. In some cases device geometry, for example memory hole diameter, may vary from level to level and operating characteristics may be adjusted accordingly. U.S. patent application Ser. No. 14/064,823, entitled "Block Structure Profiling in Three Dimensional Memory," filed on Oct. 28, 2013, which is hereby incorporated by reference in its entirety, describes characterizing memory hole diameter at different levels (different layers). Such characterization may be used to optimize operating parameters from layer to layer. In some cases, factory testing measures some variation and sets certain operating parameters accordingly in a parameter trimming process. In some cases, operating parameters are modified as a memory array, or a portion of a memory array, becomes worn. For example, a count may be maintained of the number of write-erase cycles ("hot count") for blocks of a memory array, with operating parameters being modified to compensate for changes to memory cells as they become worn. The present scheme may be combined with any such scheme, or schemes. For example, a location based scheme may provide one or more offsets, or deltas, to parameters used in a baseline zone. The parameters used in the baseline zone may be based on factory testing, and may be updated according to write-erase cycle count or other updating mechanism.

While FIG. 11 shows a block in which sets of strings are zoned into three different zones, any suitable number of zones may be used. In some cases a single edge zone may be used (e.g. zone 1 and zone 3 may be treated as a single zone) so that just two zones may be used. In this case, the edge zone is formed of non-contiguous sets of strings (i.e. there are strings of another zone physically separating strings of such a single edge zone). Thus, zones are not necessarily formed of contiguous sets of strings. However, because of differences in RC delay (as illustrated in FIG. 10A) and other differences, there may be significant differences between sets of strings at opposing edges so that using different zones for each edge may be preferable. In other cases, more than three zones may be used. For example, interior strings may be zoned into multiple zones so that in addition to two edge zones there are two or more interior zones. The number of sets of strings per zone may be any suitable number. While FIG. 11 shows just two sets of strings in each edge zone, a zone may consist of a single set of strings (e.g. string 1 may be an entire edge zone and string 16 may be another entire edge zone). An edge zone may also contain three or more sets of strings (e.g. zone 1 could be formed of strings 1-3, or strings 1-4, etc.). The number of sets of strings in an interior zone may depend on the number of sets of strings in a block. In general, the number of zones used, and the number of sets of strings in any particular zone, depends on how characteristics of different sets of strings vary for a given design of memory array. Sets of strings are generally zoned so that sets of strings with similar characteristics are zoned together. More zones may allow more precise customization of operating parameters for each zone but may require more overhead to characterize a sample set of strings for each zone and to obtain and store operating parameters for each zone.

Characterization of a reference set of strings may be performed in any suitable manner. According to an example, characterization information may be obtained from programming data to memory cells (e.g. using default operating parameters) and observing the time and/or voltages needed to bring memory cells along a word line to their programmed states. Programming of flash memory cells along a word line generally includes applying a series of programming pulses to the word line, with appropriate voltages on channels to promote or inhibit charge flow to charge storage elements. In some systems, the number of programming pulses needed to program a word line and/or other programming parameters may be recorded and used as characterization information. U.S. patent application Ser. No. 13/940,504, filed on Jun. 12, 2013, entitled, "Efficient smart verify method for programming 3D non-volatile memory," and corresponding U.S. Provisional Application No. 61/763,085, filed on Feb. 11, 2013, which are hereby incorporated by reference in their entirety, describe using the number of programming pulses (loop count) for an initial set of memory cells to determine an appropriate programming voltages for subsequent memory cells. U.S. patent application Ser. No. 14/025,160, filed on Sep. 12, 2013, entitled, "Vread bias allocation on word lines for read disturb reduction in 3D non-volatile memory," which is hereby incorporated by reference in its entirety, describes calculating read pass voltages based on program voltage trim values.

Figure 12:
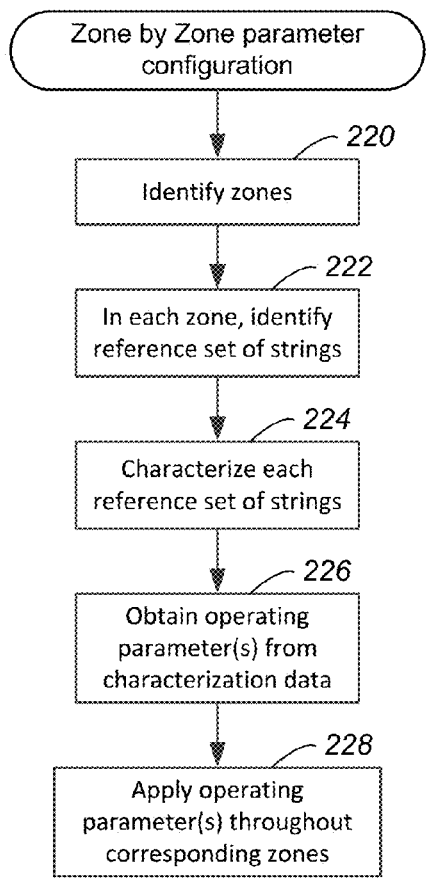
FIG. 12 shows a scheme for zone by zone parameter configuration.

FIG. 12 shows an example of zone by zone parameter configuration. First, sets of strings of a block are zoned into two or more separate zones 220. Division into zones may be the same for all blocks on a particular die, and may be the same for all similar dies (i.e. the same for a given design). Alternatively, zoning may be more customized (e.g. different zoning for different dies, or for different blocks within a die). Zones may be configured during initialization and may be maintained throughout the lifecycle of a memory so that zones are static. Alternatively, sets of strings may be rezoned after the memory has been in use for some time so that zones are dynamic and may adapt to changes in the memory array that occur during the lifecycle of the memory.

In each zone, a set of strings is identified as a reference set of strings 222. A reference set of strings may be any set of strings within the zone that is considered representative of the zone. Assuming that the zones are configured in an appropriate manner then all sets of strings within a given zone should have reasonably similar characteristics and any set of strings may be chosen. It may be preferable to choose a set of strings that is likely to be in the middle of any range of characteristics. Thus, for example, where a zone extends over several contiguous sets of strings, a set of strings that is physically located at or near the middle of such sets of strings may be chosen as the sample set of strings.

In each zone, the reference set of strings is then characterized 224. For example, data may be written, read, and/or erased along word lines of the sample set of strings using default operating parameters and characterization data may be collected. Such characterization data may include the number of programming pulses used to program or erase data along a word line of the sample set (loop count), the number of bad bits read, the highest programming or erase voltage used, and/or other characteristics.

Subsequently, modified operating parameters are obtained from the characterization data. Modified operating parameters may include any parameter used during programming, reading, or erasing. For example, programming voltages, read voltages, and erase voltages may be obtained from characterization data.

Subsequently, the modified operating parameters are applied in the corresponding zones. Thus, operating parameters obtained from a reference set of strings in zone 1 are applied to sets of strings in zone 1. Operating parameters obtained from a reference set of strings in zone 2 are applied to sets of strings in zone 2, and so on.

Figure 13:
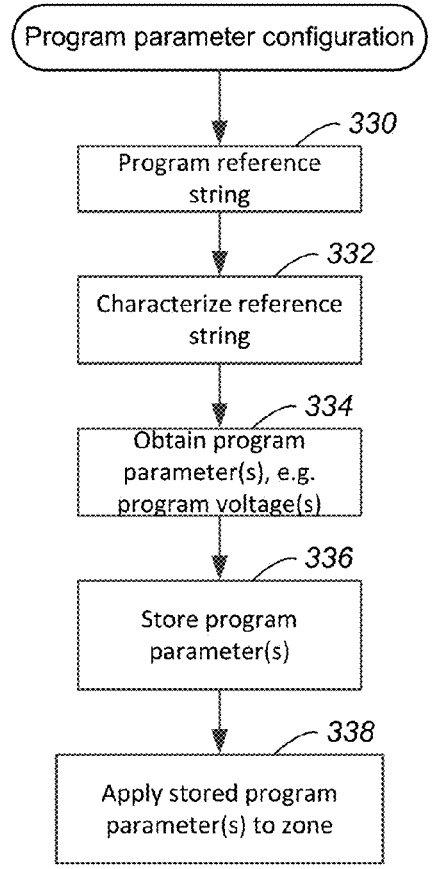
FIG. 13 shows an example of programming parameter configuration.

FIG. 13 shows a specific example of configuring programming parameters during execution of a write command (i.e. not as a separate configuration operation, or initialization operation). At least one word line of a reference set of strings is programmed with data 330, which in this case is host data. The reference set of strings is at least partially characterized (at least for programming characteristics of at least one word line of the reference set of strings) 332 during this programming. For example, program loop count and maximum programming voltage may be obtained for each word line (or at least one word line) of the set of strings. Subsequently, this characterization information is used to obtain modified programming parameters including programming voltages 334. For example, where the loop count and/or highest programming voltage used to program a word line of the reference set of strings is high, programming voltages may be set at a relatively high level so that subsequent programming may be performed efficiently. Where loop count and/or highest programming voltage are low, programming voltages may be set at a relatively low level so that subsequent programming does not result in overprogramming. The modified programming parameters are then stored 336 (these may be stored as offsets from default operating conditions, or in some other form). The stored programming parameters are then used for further programming in the zone 338.

In the example of FIG. 13, after programming data along a word line of a sample set of strings, and using characterization data obtained from the programming to obtain programming parameters, the obtained programming parameters are used for corresponding word lines of other sets of strings in the same zone. Thus, characterization is performed on a word line of the reference set of strings, followed by programming of corresponding word lines of other strings in the same zone. Then, programming may move to the next zone, starting with the reference set of strings, to obtain characterization data, and proceeding to other sets of strings. The order of programming may be such that the sample set of strings is the first programmed in a given zone so that characterization data may be used immediately after it is obtained and new characterization data may be obtained each time the block is written. When connected word lines of all zones have been programmed (e.g. WL0 of each set of strings), programming moves to the next word lines (e.g. WL1). Thus, programming may progress from layer to layer. Characterization at different layers allows operating parameters to be optimized according to different layers within a zone. Thus, operating parameters may adjust for differences in geometry and driver connection at different layers. Characterization may be performed automatically (e.g. where the first word line in a given zone is the reference word line) or may be performed in response to a command from a controller. For example, a controller may send a command to perform characterization and obtain modified operating parameters at different levels. Such a command could be sent at every level, or at selected levels. Characterization and parameter configuration may thus be performed integrally with programming or in some separate operation. In this way, operating parameters are adaptive not only to differences from zone to zone, but also adaptive to differences from layer to layer within a given zone, and adaptive to changes over time.

In another example, characterization data may be stored and used for multiple writes of the same zone. Characterization may be performed periodically, or may be performed just once as part of initialization. For example, an initialization operation may program word lines of reference sets of strings of a block in order to obtain characterization data that is subsequently used to calculate programming parameters for corresponding zones. These programming parameters are then stored for subsequent use in the corresponding zones over multiple program operations.

Figure 14:
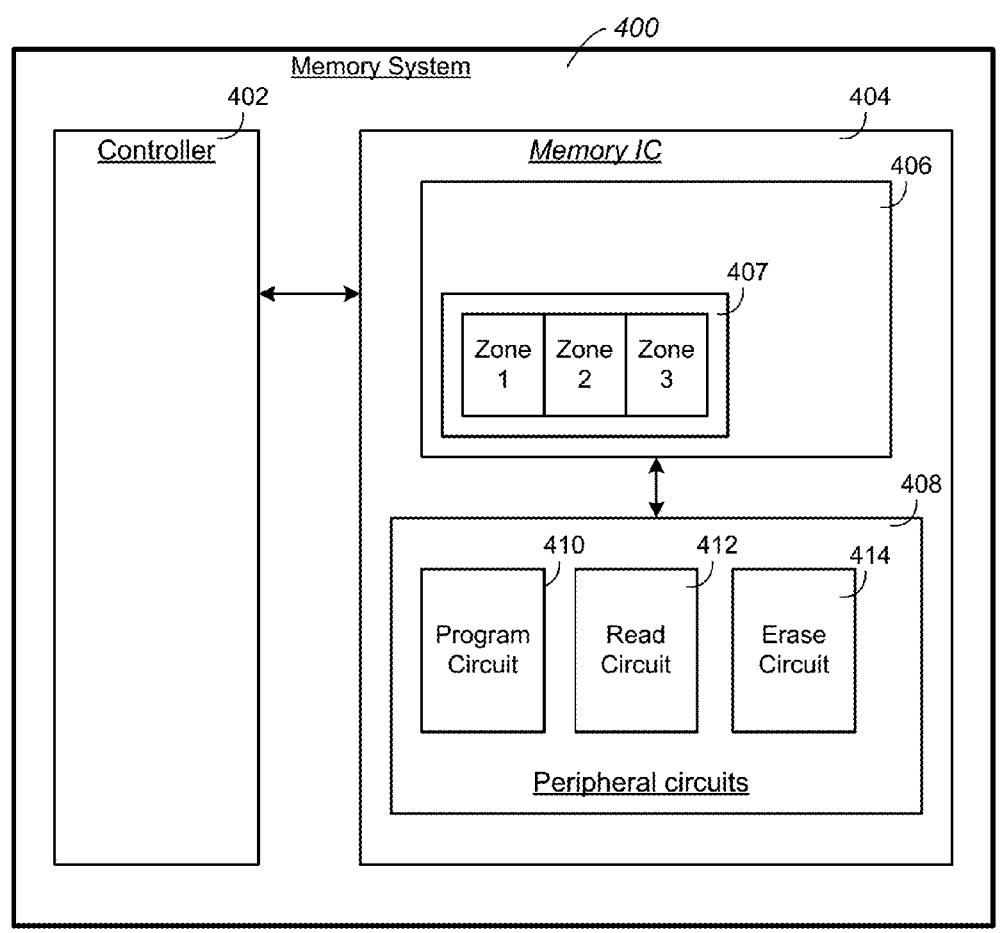
FIG. 14 shows an example of hardware that may be used.

FIG. 14 shows an example of hardware that may be used to implement aspects of the present invention. A memory system 400 includes a memory controller 402 and a memory integrated circuit (IC) 404. Memory IC 404 includes a memory array 406, including multiple blocks, where a block is the unit of erase of the memory array. An example of such a block is block 407, in which sets of strings are divided into three zones, zone 1-zone 3. Memory IC 404 further includes peripheral circuits 408. Peripheral circuits 408 include programming circuit 410 which is configured to apply different programming conditions when programming different zones (e.g. first set of programming conditions to zone 1, second set to zone 2, and third set to zone 3). Peripheral circuits 408 further include reading circuit 412 that is configured to apply different reading conditions when reading different zones (e.g. first set of read condition to zone 1, second set to zone 2, and third set to zone 3). Peripheral circuits 408 further include erase circuit 414 that is configured to apply different erase conditions (e.g. erase verify conditions) when erasing different zones (e.g. first set of erase conditions to zone 1, second set to zone 2, and third set to zone 3).

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are It is claimed:

1. A three dimensional nonvolatile memory comprising:
a block that comprises a plurality of zones, each zone containing at least one separately selectable set of strings, corresponding word lines of all sets of strings in the block formed from a continuous conductive body;
a first reference set of strings in a first zone, the first reference set of strings providing first characterization data that is used to configure a first set of operating parameters for the first zone, the first set of operating parameters including parameters applied to memory cells of the first zone during programming, reading, or erasing;
a second reference set of strings in a second zone that is adjacent to the first zone, the second reference set of strings providing second characterization data that is used to configure a second set of operating parameters for the second zone, the second set of operating parameters including parameters applied to memory cells of the second zone during programming, reading, or erasing that are different to the first set of operating parameters; and
memory access circuits that are configured to access memory cells of the first zone using the first set of operating parameters and to access memory cells of the second zone using the second set of operating parameters.

2. The three dimensional nonvolatile memory of claim 1 further comprising a programming circuit configured to apply a first set of programming parameters when programming memory cells of word lines in the first zone and configured to apply a second set of programming parameters when programming memory cells of word lines in the second zone.

3. The three dimensional nonvolatile memory of claim 1 further comprising a reading circuit configured to apply a first set of reading parameters when reading memory cells of word lines in the first zone and configured to apply a second set of reading parameters when reading memory cells of word lines in the second zone.

4. The three dimensional nonvolatile memory of claim 1 wherein the first zone consists of sets of strings that do not lie along edges of the block and the second zone includes a set of strings that lies along an edge of the block.

5. The three dimensional nonvolatile memory of claim 4 further comprising a third reference set of strings in a third zone that consists of sets of strings that do not lie along edges of the block, the third zone and the first zone having different characteristics resulting from different internal structures.

6. The three dimensional nonvolatile memory of claim 2 wherein the first set of programming parameters includes a first programming voltage applied to the memory cells of word lines in the first zone and the second set of programming parameters includes a second programming voltage applied to the memory cells of word lines in the second zone, the second programming voltage being different to the first programming voltage.

7. The three dimensional nonvolatile memory of claim 3 wherein the first set of reading parameters includes a first read voltage applied to the memory cells of word lines in the first zone and the second set of reading parameters includes a second read voltage applied to the memory cells of word lines in the second zone, the second read voltage being different to the first read voltage.

8. The three dimensional nonvolatile memory of claim 1 wherein the first characterization data is collected during programming data in memory cells of the first reference set of strings using default operating parameters, the first characterization data including the number of programming pulses and/or the highest programming voltage used to program the data.

9. The three dimensional nonvolatile memory of claim 1 wherein the first reference set of strings in the first zone and the second reference set of strings in the second zone store host data.

10. The three dimensional nonvolatile memory of claim 4 further comprising a third reference set of strings in a third zone that includes a set of strings that lies along an edge of the block, the first zone located between the second zone and the third zone.

11. A nonvolatile memory system comprising:
a block in a three dimensional memory integrated circuit, the block including a plurality of zones, each zone containing at least one separately selectable set of strings, corresponding word lines of all sets of strings in the block formed from a continuous conductive body;
a first reference set of strings in a first zone, the first reference set of strings providing first characterization data that is used to configure a first set of operating parameters for the first zone, the first set of operating parameters including parameters applied to memory cells of the first zone during programming, reading, or erasing;
a second reference set of strings in a second zone, the second reference set of strings providing second characterization data that is used to configure a second set of operating parameters for the second zone, the second set of operating parameters including parameters applied to memory cells of the second zone during programming, reading, or erasing that are different to the first set of operating parameters; and
peripheral circuits that are configured to access memory cells of the first zone using the first set of operating parameters and to access memory cells of the second zone using the second set of operating parameters.

12. The nonvolatile memory system of claim 11 wherein the peripheral circuits include a programming circuit configured to apply a first set of programming parameters when programming memory cells of word lines in the first zone and configured to apply a second set of programming parameters when programming memory cells of word lines in the second zone.

13. The nonvolatile memory system of claim 11 wherein the peripheral circuits include a reading circuit configured to apply a first set of reading parameters when reading memory cells of word lines in the first zone and configured to apply a second set of reading parameters when reading memory cells of word lines in the second zone.

14. The nonvolatile memory system of claim 11 wherein the first zone consists of sets of strings that do not lie along edges of the block and the second zone includes a set of strings that lies along an edge of the block.

15. The nonvolatile memory system of claim 14 further comprising a third reference set of strings in a third zone that consists of sets of strings that do not lie along edges of the block, the third zone and the first zone having different characteristics resulting from different internal structures.

16. The nonvolatile memory system of claim 12 wherein the first set of programming parameters includes a first programming voltage applied to the memory cells of word lines in the first zone and the second set of programming parameters includes a second programming voltage applied to the memory cells of word lines in the second zone, the second programming voltage being different to the first programming voltage.

17. The nonvolatile memory system of claim 13 wherein the first set of reading parameters includes a first read voltage applied to the memory cells of word lines in the first zone and the second set of reading parameters includes a second read voltage applied to the memory cells of word lines in the second zone, the second read voltage being different to the first read voltage.

18. The nonvolatile memory system of claim 11 wherein the first characterization data is collected during programming data in memory cells of the first reference set of strings using default operating parameters, the first characterization data including the number of programming pulses and/or the highest programming voltage used to program the data.

19. The nonvolatile memory system of claim 18 wherein the first characterization data includes a high number of programming pulses and/or a high highest programming voltage that is used to configure the first set of operating parameters to include a first programming voltage applied to the memory cells of word lines in the first zone, the second characterization data includes a low number of programming pulses and/or low highest programming voltage that is used to configure the second set of operating parameters to include a second programming voltage applied to the memory cells of word lines in the second zone, the second programming voltage being lower than the first programming voltage.

20. The nonvolatile memory system of claim 14 further comprising a third reference set of strings in a third zone that includes a set of strings that lies along an edge of the block, the first zone located between the second zone and the third zone.

* * * * *